(12) United States Patent
Weaver

(10) Patent No.: US 6,888,305 B2
(45) Date of Patent: May 3, 2005

(54) ENCAPSULATION STRUCTURE THAT ACTS AS A MULTILAYER MIRROR

(75) Inventor: Michael Stuart Weaver, Princeton, NJ (US)

(73) Assignee: Universal Display Corporation, Ewing, NJ (US)

( * ) Notice: Subject to any disclaimer, the term of this patent is extended or adjusted under 35 U.S.C. 154(b) by 462 days.

(21) Appl. No.: 09/992,437

(22) Filed: Nov. 6, 2001

(65) Prior Publication Data

US 2003/0085652 A1 May 8, 2003

(51) Int. Cl.⁷ ................................................ H05B 33/00
(52) U.S. Cl. ...................................... 313/506; 428/690
(58) Field of Search ................................ 313/504, 506, 313/503; 445/24, 25; 428/690, 917; 359/838; 385/131

(56) References Cited

U.S. PATENT DOCUMENTS

| | | | |
|---|---|---|---|
| 4,842,893 A | 6/1989 | Yializis et al. | 427/44 |
| 4,954,371 A | 9/1990 | Yializis | 427/44 |
| 5,260,095 A | 11/1993 | Affinito | 427/124 |
| 5,674,636 A | 10/1997 | Dodabalapur et al. | 428/690 |
| 5,707,745 A | 1/1998 | Forrest et al. | 428/432 |
| 5,757,126 A | 5/1998 | Harvey, III et al. | 313/506 |
| 5,780,174 A | 7/1998 | Tokito et al. | 428/690 |
| 5,814,416 A | 9/1998 | Dodabalapur et al. | 428/690 |
| 5,834,893 A | 11/1998 | Bulovic et al. | 313/506 |
| 5,920,080 A | 7/1999 | Jones | 257/40 |
| 6,146,225 A | 11/2000 | Sheats et al. | 445/24 |
| 6,224,948 B1 | 5/2001 | Affinito | 427/488 |
| 6,268,295 B1 | 7/2001 | Ohta et al. | 438/735 |
| 2004/0004988 A1 * | 1/2004 | Cok et al. | 372/70 |

FOREIGN PATENT DOCUMENTS

| | | | |
|---|---|---|---|
| EP | 0 977 469 A2 | 2/2000 | H05B/33/04 |
| WO | WO 00/65879 | 2/2000 | H05B/33/00 |
| WO | WO 00/26973 | 5/2000 | H01L/51/20 |
| WO | WO 00/36665 | 6/2000 | H01L/51/20 |

OTHER PUBLICATIONS

"Electroluminescence from Organic Light Emitting Diodes", M.S. Weaver, PhD Thesis, University of Sheffield UK (1997), pp.132–138, 154–158.

* cited by examiner

Primary Examiner—Joseph Williams
(74) Attorney, Agent, or Firm—Mayer Fortkort & Williams, PC; David B. Bonham, Esq.

(57) ABSTRACT

The present invention is directed to novel structures for use in connection with OLED devices that simulaneously act as a multiplayer mirror and as a barrier to harmful species in the exterior environment. According to one embodiment of the invention, an OLED structure includes (a) a substrate; (b) an OLED over the substrate that includes (i) a first electrode, (ii) an emission region above the first electrode and (iii) a second electrode above the emission region, wherein the OLED emits light having a range of wavelengths upon being turned on; and (c) a multiplayer mirror over the substrate, the multiplayer mirror including an alternating series of (i) planarizing layers having a first refractive index and (ii) high-density layers having a second refractive index that differs from the first refractive index. The thicknesses of the planarizing layers and of the high-density layers in this embodiment are selected such that the multiplayer mirror is tuned to transmit light at a peak wavelength within the range of wavelengths emitted by the OLED. Moreover, the planarizing layers and the high-density layers cooperate to restrict transmission of water and oxygen.

32 Claims, 3 Drawing Sheets

ENCAPSULATION STRUCTURE THAT ACTS AS A MULTILAYER MIRROR

FIELD OF THE INVENTION

The present invention relates to structures that protect organic light emitting devices from harmful species in the surrounding environment and to structures that reflect and transmit light that is emitted from such devices.

BACKGROUND OF THE INVENTION

Organic light emitting devices ("OLEDs"), including both polymer and small-molecule OLEDs, are potential candidates for a great variety of virtual-and direct-view type displays, such as lap-top computers, televisions, digital watches, telephones, pagers, cellular telephones, calculators and the like. Unlike inorganic semiconductor light emitting devices, organic light emitting devices are generally simple and relatively easy and inexpensive to fabricate. Also, OLEDs readily lend themselves to applications requiring a wide variety of colors and to applications that concern large-area devices.

In general, two-dimensional OLED arrays for imaging applications are known in the art and typically include an OLED display area that contains a plurality of active pixels arranged in rows and columns. FIG. 1A is a simplified schematic representation (cross-sectional view) of an OLED structure of the prior art. The OLED structure shown includes a single active pixel 15 which includes an electrode region such as anode region 12, a light emitting region 14 over the anode region 12, and another electrode region such as cathode region 16 over the a light emitting region 14. The active pixel 15 is disposed on a substrate 10. With the aid of a sealing region 25, the cover 20 and the substrate 10 cooperate to restrict transmission of oxygen and water vapor from an outer environment to the active pixel 15.

Traditionally, light from the light emitting layer 14 was transmitted downward through the substrate 10. In such a "bottom-emitting" configuration, the substrate 10 and anode 12 are formed of transparent materials. The cathode 16 and cover 20, on the other hand, need not be transparent in this configuration.

Other OLED architectures are also known in the art, including "top-emitting" OLEDs and transparent OLEDs (or "TOLEDs"). For top-emitting OLEDs, light from the light emitting layer 14 is transmitted upward through cover 20. Hence, the substrate 10 can be formed of opaque material, while the cover 20 is transparent. In some top-emitting configurations that are based on a design like that illustrated in FIG. 1A, a transparent material is used for the cathode 16, while the anode 12 need not be transparent. In other top-emitting configurations, the positions of the anode 12 and cathode 16 in FIG. 1A are switched as illustrated in FIG. 1B, such that a transparent anode 12 is used. In this embodiment, the cathode 16 can be opaque. This is sometimes referred to as an "inverted" configuration.

For TOLEDs, in which light is emitted in both up and down directions (that is, out of both the top and bottom of the device), the substrate 10, anode 12, cathode 16 and cover 20 are all transparent. The configuration used can be like that of FIG. 1A or that of FIG. 1B.

In forming an OLED, a layer of reactive metal is typically utilized as the cathode to ensure efficient electron injection and low operating voltages. However, reactive metals and their interface with the organic material are susceptible to oxygen and moisture, which can severely limit the lifetime of the devices. Moisture and oxygen are also known to produce other deleterious effects. For example, moisture and oxygen are known to increase "dark spot areas" in connection with OLEDs. Various barrier regions are known in the art for excluding such exterior environmental species, including multi-layer structures such as those discussed in U.S. Pat. Nos. 5,757,126, 6,146,225 and 6,268,295 the entire disclosures of which are hereby incorporated by reference.

It is also known in the art to make use of distributed Bragg reflectors (DBRs) in connection with OLEDs. These DBRs are multilayer mirror structures that are typically based upon the use of a so called "quarter-wave stack". Such structures can, among other things, narrow the spectrum of the emission band, enhance the peak radiated intensity, and modify the directionally of the emitted light. Examples of such structures can be found, for example, in U.S. Pat. No. 5,674,636 to Dodabalapur et al., U.S. Pat. No. 5,814,416 to Dodabalapur et al., U.S. Pat. No. 5,834,893 to Bulovic et al. and U.S. Pat. No. 5,920,080 to Jones. The entire disclosure of each of these patents is hereby incorporated by reference.

SUMMARY OF THE INVENTION

The present invention is directed to novel structures for use in connection with OLED devices that simultaneously act as a multilayer mirror and as a barrier to harmful species in the exterior environment.

According to an embodiment of the invention, an OLED structure is provided that comprises: (a) a substrate; (b) an OLED over the substrate that comprises a first electrode, an emission region above the first electrode and a second electrode above the emission region, wherein the OLED emits light having a range of wavelengths upon being turned on; and (c) a multilayer mirror over the substrate, the multilayer mirror comprising an alternating series of (i) planarizing layers having a first refractive index and (ii) high-density layers having a second refractive index that differs from the first refractive index. The thicknesses of the planarizing layers and of the high-density layers in this embodiment are selected such that the multilayer mirror is tuned to transmit light at a peak wavelength within the range of wavelengths emitted by the OLED. Moreover, the planarizing layers and the high-density layers cooperate to restrict transmission of water and oxygen.

Preferably, the multilayer mirror is a quarter-wave stack. The first electrode is preferably an anode and the second electrode is preferably a cathode, but the opposite configuration can also be used. Moreover, depending on the application, the OLED device can be a top-emitting device, a bottom-emitting device or a transparent device.

In some instances, the quarter-wave stack is provided between the OLED and the substrate, and the first electrode is transparent. The second electrode can also be transparent in these instances, in which case a further quarter wave stack can be provided over the second electrode, if desired. On the other hand, the second electrode can also be opaque, in which case it is preferably reflective.

In other instances, the quarter-wave stack is provided over the OLED, and the second electrode is transparent. In these instances, the first electrode can be, for example, an opaque electrode, in which case it is preferably reflective.

According to another embodiment of the invention, an OLED structure is provided that comprises: (a) a transparent substrate; (b) an OLED over the transparent substrate that comprises a transparent anode, an emission region above the transparent anode and a reflective cathode above the emission region, wherein the OLED emits light having a range of wavelengths upon being turned on; and (c) a quarter-wave stack provided between the OLED and the substrate, the quarter-wave stack comprising an alternating series of (i) planarizing layers having a first refractive index and (ii) high-density layers having a second refractive index that differs from the first refractive index.

The thicknesses of the planarizing layers and of the high-density layers in this embodiment are selected such that the quarter-wave stack is tuned to transmit light at a peak wavelength within the range of wavelengths emitted by the OLED. Moreover, the planarizing layers and the high-density layers cooperate to restrict transmission of water and oxygen.

According to another embodiment of the invention, an OLED structure is provided that comprises: (a) a substrate; (b) an OLED over the substrate that comprises a reflective anode, an emission region above the reflective anode and a transparent cathode above the emission region, wherein the OLED emits light having a range of wavelengths upon being turned on; and (c) a quarter-wave stack over the OLED, the quarter-wave stack comprising an alternating series of (i) planarizing layers having a first refractive index and (ii) high-density layers having a second refractive index that differs from the first refractive index. As above, the thicknesses of the planarizing layers and of the high-density layers in this embodiment are selected such that the quarter-wave stack is tuned to transmit light at a peak wavelength within the range of wavelengths emitted by the OLED, and the planarizing layers and the high-density layers cooperate to restrict transmission of water and oxygen.

An advantage of the present invention is that desirable optical and barrier properties can be simultaneously provided by a single multilayer stack.

These and other embodiments and advantages of the present invention will become readily apparent to those of ordinary skill in the art upon review of the disclosure to follow.

As is commonly the case with such figures, the above are simplified schematic representations and the actual structures will differ in numerous respects including the relative scale of the components.

DETAILED DESCRIPTION OF THE INVENTION

The present invention now will be described more fully hereinafter with reference to the accompanying drawings in which preferred embodiments of the invention are shown. This invention may, however, be embodied in different forms and should not be construed as limited to the embodiments set forth herein.

As used herein, a "layer" of a given material includes a region of that material whose thickness is small compared to both its length and width. Examples of layers include sheets, foils, films, laminations, coatings, and so forth. As used herein a layer need not be planar, but can be bent, folded or otherwise contoured, for example, to at least partially envelop another component. A "layer" can contain two or more subordinate layers or "sublayers".

Figure 1A:
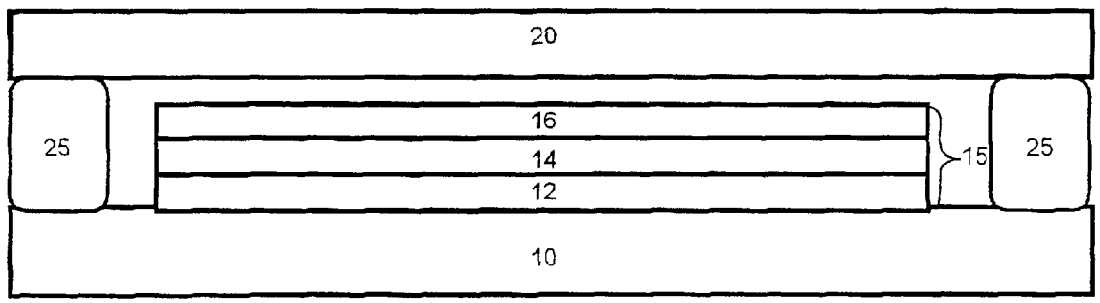
FIGS. 1A and 1B are simplified schematic representations (cross-sectional views) of known OLED structures.
Figure 1B:
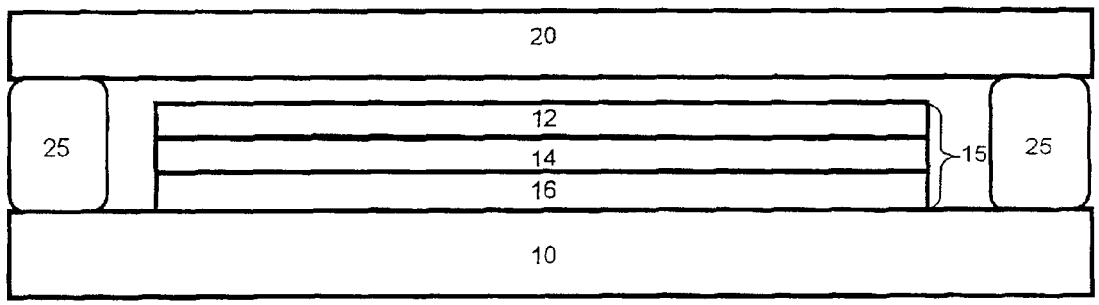
Figure 2:
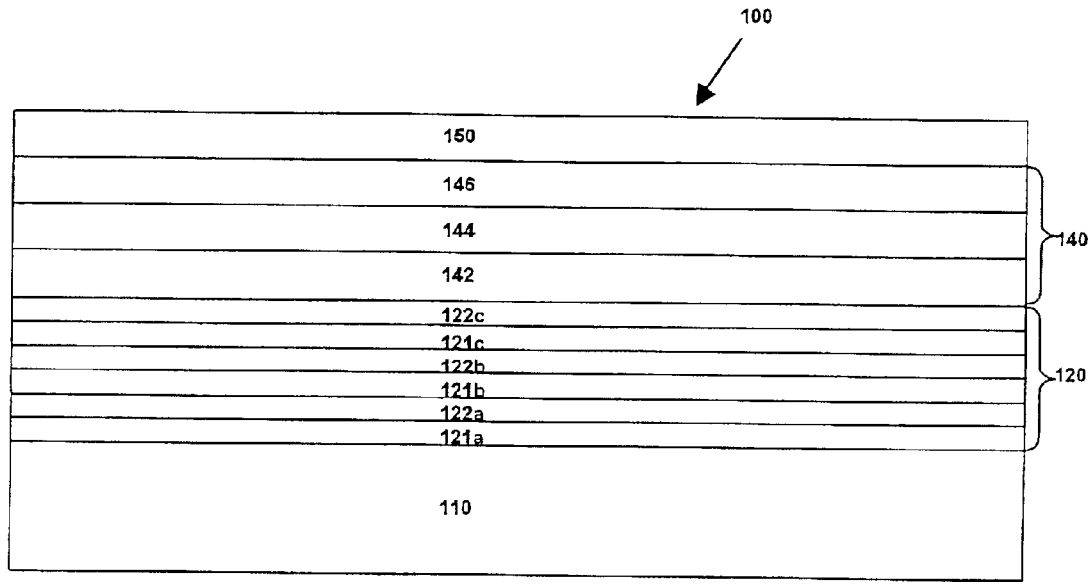
FIG. 2 is a schematic cross-sectional view of an OLED structure, in accordance with an embodiment of the present invention.

Referring now to FIG. 2, an OLED structure generally designated by the numeral 100 is illustrated, which includes a substrate 110, a multilayer mirror (in this case, a quarter-wave stack 120), an OLED 140, and a cover region 150.

The OLED 140 can be any OLED known in the art. For example, as noted above, the OLED generally comprises electrode regions 142, 146, which acts as the anode and cathode for the OLED 140. The OLED 140 also includes a light-emitting region 144 (emission region) disposed between the electrode regions 142, 146.

The light emitting region 144 can be provided in connection with a number of known configurations, including the following: (a) a three-layer configuration comprising a hole transporting layer, an emission layer and an electron transporting layer (i.e., a double heterostructure configuration), (b) a two-layer configuration comprising a hole transporting layer and a layer that provides both emission and electron transporting functions or a two-layer configuration comprising an electron transporting layer and a layer that provides both emission and hole transporting functions (i.e., single hetero structure configurations) and (c) a configuration comprising a single layer that provides hole transporting, electron transporting and emission functions (i.e., a single layer configuration). In each configuration, additional layers may also be present, for example, layers that enhance hole injection or electron injection, or layers that serve to block holes or electrons. Several structures for such devices are discussed, for example, in U.S. Pat. No. 5,707,745, the entire disclosure of which is hereby incorporated by reference. Other more complex OLED architectures are also practiced in the art.

In the embodiment illustrated in FIG. 2, a microcavity effect is typically created by the combination of the electrode region 146 and the quarter-wave stack 120 The electrode region 142 in this embodiment is transparent to radiation at the wavelength of interest, which is typically the desired output wavelength of the OLED. By "transparent" is meant that attenuation of radiation as it passes through the region of interest (in this case, electrode region 142) is low, with transmissivities typically greater than 80% at the wavelength of interest.

Where the electrode region 142 is selected to be an anode, which is a preferred configuration, materials of appropriate transparency may include metal oxides such as indium tin oxide (ITO), zinc tin oxide or other materials known in the art. Where the electrode region 142 is selected to be a cathode, materials of appropriate transparency may include metal/metal oxide combinations such as Mg—Ag/ITO, LiF/Al/ITO or other materials known in the art.

In the case where the device of FIG. 2 is a bottom-emitting OLED, which is a preferred embodiment for the structure of FIG. 2, the substrate 110 is transparent, while the cover 150 need not be transparent. The electrode region 146 in this configuration is preferably formed from a reflective material, for example, to intensify the cavity effects of the device. As used herein, "reflective" means that a substantial amount of the radiation of the wavelength of interest is reflected—typically at least 80%. Where the electrode region 146 is selected to be a cathode, materials of appropriate reflectivity may include aluminum, aluminum/ lithium, aluminum/lithium fluoride, aluminum/lithium oxide, or other materials known in the art. Where the electrode region 146 is selected to be an anode, materials of appropriate reflectivity may include gold, chromium, nickel, platinum, or other materials known in the art.

In the case where the device of FIG. 2 is a TOLED, both the substrate 110 and the cover 150 are transparent. In addition, electrode region 146 is transparent. Appropriately transparent materials for electrode region 146 are those discussed above in connection with electrode region 142.

In the case where the device of FIG. 2 is a top-emitting OLED, the cover 150 and the electrode region 146 are transparent.

One particularly preferred configuration for the device of FIG. 2 is a bottom-emitting configuration in which substrate 110 is a transparent substrate, electrode region 142 is a transparent anode and electrode region 146 is a reflective cathode. numeral 200, in accordance with another embodiment of the invention. In this embodiment, a multilayer mirror (in this case, a quarter-wave stack 220) is provided over electrode region 246 and opposite the substrate 210.

As will become more apparent below, in view of the ability of the quarter-wave stack 220 of the present invention to block the transmission of harmful species in the ambient environment, a separate cover is not necessary in this embodiment. The quarter-wave stack 220 is shown as being provided directly upon electrode region 246 in FIG. 3, but intervening regions, including any additional substrate that may be used in the formation of the quarter-wave stack 220, are possible. Intervening layers can also be provided between numerous other layers of the devices of the present invention as is known in the art.

Figure 3:
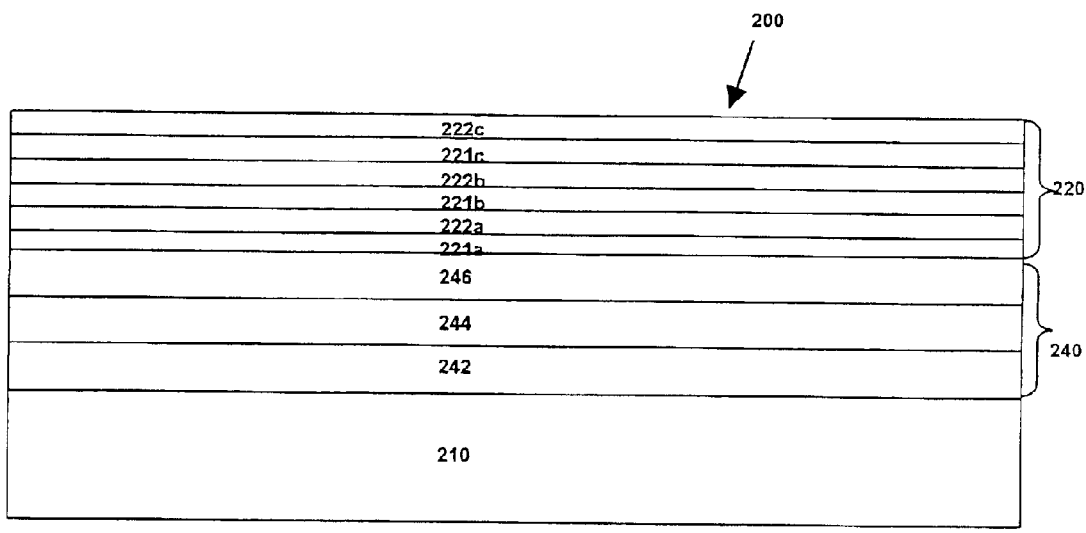
FIG. 3 is a schematic cross-sectional view of an OLED structure, in accordance with another embodiment of the present invention.

In the embodiment illustrated in FIG. 3, a microcavity effect is typically formed by the combination of the electrode region 242 and the quarter-wave stack 220. The electrode region 246 is transparent in this embodiment.

In instances where the device is a bottom-emitting OLED or the device is a TOLED, the substrate 210 and the electrode region 242 are also transparent.

In the case of a top-emitting OLED, which is a preferred embodiment for the structure of FIG. 3, the electrode region 242 can be formed from a reflective material, for example, to intensify the cavity effects of the device. Alternatively, the electrode region 242 can be formed from a transparent material in the top-emitting configuration.

As in FIG. 2, electrode region 242 is preferably an anode and electrode region 246 is preferably a cathode. One particularly preferred configuration is a top-emitting configuration in which electrode region 242 is a reflective anode and electrode region 246 is a transparent cathode.

Figure 4:
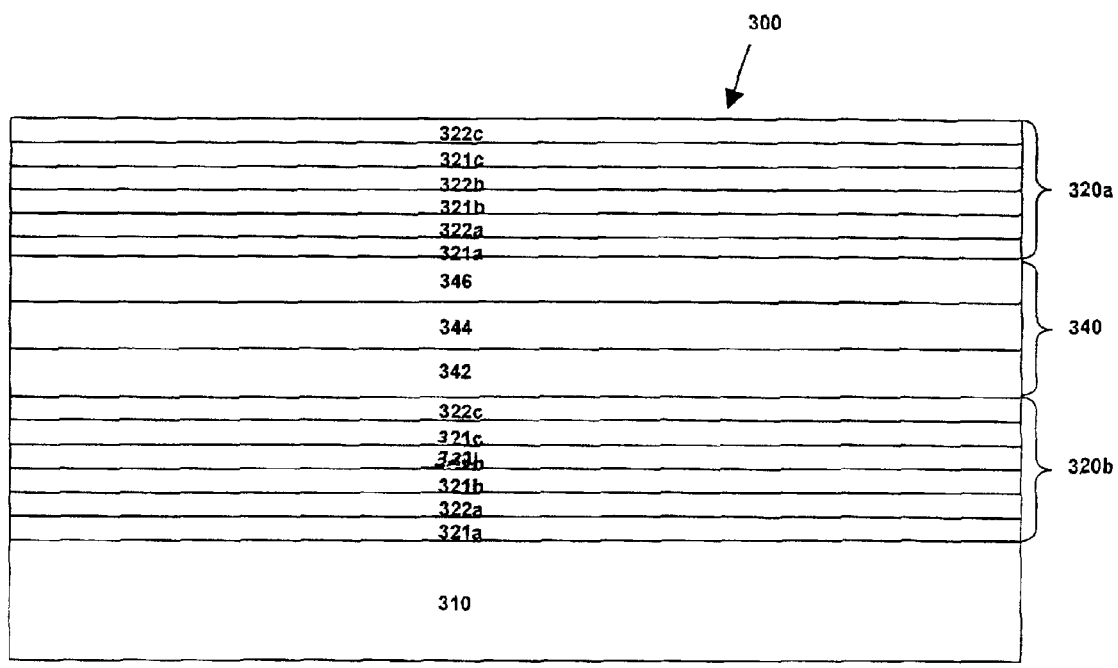
FIG. 4 is a schematic cross-sectional view of an OLED structure, in accordance with still another embodiment of the present invention.

Numerous other configurations are also possible. For example, FIG. 4 illustrates an OLED device 300, which includes a substrate 310, two multilayer mirrors (in this case, quarter-wave stacks 320a, 320b) and an OLED 340. A microcavity effect is formed by the combination of the quarter-wave stack 320a and the quarter-wave stack 320b. The electrode regions 342, 346 are transparent in this embodiment. Electrode region 342 is preferably an anode and electrode region 346 is a preferably cathode.

The OLED can be bottom-emitting, top-emitting or transparent, and permutations similar to those discussed above apply. For example, where the device is a TOLED or a bottom-emitting device, the substrate 310 is transparent. The preferred configuration for the device structure of FIG. 3 is the transparent (TOLED) configuration.

As previously noted, depending on the desired configuration, the substrate 110, 210, 310 and the cover 150 may or may not be required to be transparent. Typical materials for these components include polymers, ceramics, semiconductors and metals.

Although typically not providing substantial transparency at the thicknesses commonly used in connection with substrates and covers, metals do offer excellent barrier properties. Moreover, they can be provided in a number of configurations, for example, in the form of metal cans and foils. Preferred metals for this purpose include aluminum, gold, nickel, nickel alloys and indium, as well as other metals known in the art.

As with metals, semiconductors (for example, silicon) typically do not provide good transparency. However, semiconductors do offer good barrier properties to water, oxygen and other harmful species, and they provide a substrate upon which electronic circuitry can be built.

Ceramics offer low permeability and provide transparency in many cases. Preferred ceramics are glasses, more preferably soda lime and borosilicate glasses.

Polymers are often preferred where optical transparency is desired. However, due to the permeability of most polymers, where a polymer is selected for use as a substrate or cover, it is preferred that an additional barrier region be supplied. If desired, the multilayer mirror of the present invention can provide this function.

Referring to FIG. 2 as a specific example, the substrate 110 is typically selected based on one or more beneficial characteristics, including optical characteristics, flexibility and conformability to other surfaces, dimensional stability during processing (e.g., where web-based processing is contemplated) and adequate bonding with other components (e.g., the cooperative barrier layers of the quarter-wave stack 120 in this instance).

Where flexibility is desired, the substrates 110 may comprise paper, fabric, metal foil, flexible glass (available, for example, from Schott Glass Technologies) and/or polymer layers. More preferred flexible substrate materials are those that comprise one or more polymer components, including polyesters, polycarbonates, polyethers, polyimides, polyolefins, and fluoropolymers that are capable of providing a strong adhesive bond with other materials. Such polymer components can be supplied, for example, in connection with homopolymers, copolymers and polymer blends. Examples of some preferred polymer components include, for example, polyethersulphones, polyarylates, polyestercarbonates, polyethylenenaphthalates, polyethyleneterephthalates, polyetherimides, polyacrylates, polyimides such as Kapton® polyimide film available from DuPont, fluoropolymers such as Aclar® fluoropolymer available from Honeywell, Appear® PNB (polynorbornene) available from BF Goodrich and Arton® available from BF Goodrich. The substrate 110 in this instance typically ranges from 75 to 625 microns in thickness.

A multilayer mirror (in this case, quarter-wave stack 120) can be formed on the substrate 110 from a series of cooperative barrier layers that include both layers of planarizing material 121a–c and layers of high-density material 122a–c. These cooperative barrier layers are provided in an alternating configuration. Preferably, 2 to 10 pairs (or more) of these layers are used. Hence, while three pairs are illustrated in FIG. 2, other layer configurations are possible. Moreover, while it is preferred for the bottom layer to be a layer of planarizing material 121a as shown in FIG. 2, the bottom layer can also be, for example, a layer of high-density material. Similarly while the top layer of the structures in FIG. 2 is illustrated as a high-density layer 122c, the top layer can be, for example, a planarizing layer.

As a result, the multilayer mirror structures of the present invention also act as a composite barrier layer with good resistance to moisture and oxygen penetration. Moreover, they are flexible in nature, making them highly desirable in the construction of flexible OLEDs (FOLEDs).

By "planarizing material" is meant a material that forms a smooth planar surface upon application, rather than forming a surface that reflects irregular contours of the underlying surface. A preferred material is one that, when deposited onto a surface, forms a non-conformal liquid. This could be, for example, a polyacrylate monomer (this material is then typically subjected to ultraviolet light or an e-beam, crosslinking the monomer to form a polyacrylate). Preferred planarizing materials are polymers, such as fluorinated polymers, parylenes, cyclotenes and polyacrylates. Layers of planarizing materials 121a–c can be provided using techniques known in the art, for example, by dipping, spin coating, sputtering, evaporative coating, spraying, flash evaporation, chemical vapor deposition and so forth.

By "high-density material" is meant a material with sufficiently close atomic spacing such that diffusion of contaminant and deleterious species, particularly water and oxygen, are hindered. Preferred high-density materials include inorganic materials such as silicon oxides (SiOx), including silicon monoxide (SiO) and silicon dioxide (SiO$_2$), silicon nitrides (typically Si$_3$N$_4$), silicon oxynitrides, aluminum oxides (typically Al$_2$O$_3$), titanium oxides, indium-tin oxides (ITO), zinc indium tin oxides and metals such as silver, chromium, aluminum, gold. Layers of high-density material 122a–c can be applied using techniques known in the art such as thermal evaporation, sputtering, plasma-enhanced chemical vapor deposition (PECVD) and electron-beam techniques.

Additional information concerning the formation of multi-layer barrier regions is found in, e.g., U.S. Pat. Nos. 4,842,893, 4,954,371, 5,260,095 and 6,224,948, each of which is incorporated by reference herein in its entirety.

By selecting layers of planarizing material 121a–c and layers of high-density material 122a–c of appropriate transparency and of sufficiently differing refractive indices, a multilayer mirror can be formed. Preferably, each layer in the multilayer mirror is of thickness λ/4, where λ is the peak wavelength of the light that is selected to be transmitted. It should be noted here that, rather than a single wavelength, a distribution of wavelengths of light is typically transmitted through multilayer mirror structures, including those of the present invention. However, so long as the layer thicknesses are in the vicinity of λ/4, peak transmission levels will accordingly occur in the vicinity of λ, as is known in the art. (As a result of this distribution of transmitted wavelengths, where light of a particular wavelength is to be reflected, rather than transmitted, the thickness of the layers should be significantly different from λ/4.) Such multilayer mirrors are well known and are commonly referred to a "quarter-wave stacks" based on the thicknesses of the layers within them. The transmissivity/reflectivity of the multilayer mirror depends in a known way upon the number of layer pairs, the layer thickness and the refractive indices of the materials used.

One preferred pair of planarizing and high-density materials for the practice of the invention is polyacrylate and aluminum oxide.

Quarter-wave stacks 220, 320a, 320b, which are similar to quarter-wave stack 120, can be found in FIGS. 2 and 3.

These stacks include layers of planarizing material 221a–c, 321a–c and layers of high-density material 222a–c, 322a–c. It is noted that quarter-wave stack 320b is formed over a substrate 310. On the other hand, quarter-wave stacks 220 and 320a are formed over OLEDs 240, 340, with the OLEDs 240, 340 acting as the "substrate" for the subsequently applied cooperative barrier layers 221a–c, 222a–c, 321a–c, 322a–c.

Although the present invention has been described with respect to several exemplary embodiments, there are many other variations of the above-described embodiments that will be apparent to those of ordinary skill in the art. It is understood that these variations are within the teachings of the present invention, and that the invention is to be limited only by the claims appended hereto.

What is claimed is:

1. An OLED structure comprising:
   a substrate;
   an OLED over said substrate, said OLED comprising a first electrode, an emission region over said first electrode and a second electrode over said emission region, and said OLED emitting light having a range of wavelengths upon being turned on; and
   a multilayer mirror over said substrate, said multilayer mirror comprising an alternating series of (a) planarizing layers having a first refractive index and (b) high-density layers having a second refractive index that differs from said first refractive index,
   wherein the thicknesses of said planarizing layers and of said high-density layers are selected such that said multilayer mirror is tuned to transmit light at a peak wavelength within said range of wavelengths, and
   wherein said planarizing layers and said high-density layers cooperate to restrict transmission of water and oxygen.

2. The OLED structure of claim 1, wherein said multilayer mirror is a quarter-wave stack.

3. The OLED structure of claim 2, wherein said planarizing layers comprise a material selected from fluorinated polymers, parylenes, cyclotenes and polyacrylates.

4. The OLED structure of claim 2, wherein said high density layers comprise a material selected from silicon oxides, silicon nitrides, silicon oxynitrides, aluminum oxides, titanium oxides, indium tin oxides, zinc indium tin oxides and metals.

5. The OLED structure of claim 2, wherein said planarizing layers comprise polyacrylate and said high-density layers comprise aluminum oxide.

6. The OLED structure of claim 2, wherein said first electrode is an anode and said second electrode is a cathode.

7. The OLED structure of claim 2, wherein said OLED device is a top-emitting device.

8. The OLED structure of claim 2, wherein said OLED device is a bottom-emitting device.

9. The OLED structure of claim 2, wherein said OLED device is a transparent device.

10. The OLED structure of claim 2, wherein said quarter-wave stack is provided between said OLED and said substrate, and wherein said first electrode is a transparent electrode.

11. The OLED structure of claim 10, wherein said first electrode is a transparent anode and said second electrode is a cathode.

12. The OLED structure of claim 11, wherein said second electrode is a reflective cathode.

13. The OLED structure of claim 10, wherein said second electrode is a transparent electrode and further comprising an additional quarter-wave stack provided over said second electrode.

14. The OLED structure of claim 13, wherein said first electrode is a transparent anode and said second electrode is a transparent cathode.

15. The OLED structure of claim 2, wherein said quarter-wave stack is provided over said OLED and wherein said second electrode is a transparent electrode.

16. The OLED structure of claim 15, wherein said first electrode is an anode and said second electrode is a transparent cathode.

17. The OLED structure of claim 16, wherein said first electrode is a reflective anode.

18. An OLED structure comprising:
   a transparent substrate;
   an OLED over said transparent substrate, said OLED comprising a transparent anode, an emission region over said transparent anode and a reflective cathode over said emission region, and said OLED emitting light having a range of wavelengths upon being turned on; and
   a quarter-wave stack provided between said OLED and said substrate, said quarter-wave stack comprising an alternating series of (a) planarizing layers having a first refractive index and (b) high-density layers having a second refractive index that differs from said first refractive index,
   wherein the thicknesses of said planarizing layers and of said high-density layers are selected such that said quarter-wave stack is tuned to transmit light at a peak wavelength within said range of wavelengths, and
   wherein said planarizing layers and said high-density layers cooperate to restrict transmission of water and oxygen.

19. An OLED structure comprising:
   a substrate;
   an OLED over said substrate, said OLED comprising a reflective anode, an emission region over said reflective anode and a transparent cathode over said emission region, and said OLED emitting light having a range of wavelengths upon being turned on; and
   a quarter-wave stack over said OLED, said quarter-wave stack comprising an alternating series of (a) planarizing layers having a first refractive index and (b) high-density layers having a second refractive index that differs from said first refractive index,
   wherein the thicknesses of said planarizing layers and of said high-density layers are selected such that said quarter-wave stack is tuned to transmit light at a peak wavelength within said range of wavelengths, and
   wherein said planarizing layers and said high-density layers cooperate to restrict transmission of water and oxygen.

20. The OLED structure of claim 1, wherein said planarizing layers comprise a material selected from fluorinated polymers, parylenes, cyolotenes and polyacrylates.

21. The OLED structure of claim 1, wherein said high density layers comprise a material selected from silicon oxides, silicon nitrides, silicon oxynitrides, aluminum oxides, titanium oxides, indium tin oxides, zinc indium tin oxides and metals.

22. The OLED structure of claim 1, wherein said planarizing layers comprise polyacrylate and said high-density layers comprise aluminum oxide.

23. The OLED structure of claim 1, wherein said first electrode is an anode and said second electrode is a cathode.

24. The OLED structure of claim 1, wherein said OLED device is a top-emitting device.

25. The OLED structure of claim 1, wherein said OLED device is a bottom-emitting device.

26. The OLED structure of claim 1, wherein said OLED device is a transparent device.

27. The OLED structure of claim 1, wherein said first electrode is a transparent electrode.

28. The OLED structure of claim 1, wherein said second electrode is a transparent electrode.

29. The OLED structure of claim 1, wherein said OLED structure is flexible.

30. The OLED structure of claim 2, wherein said OLED structure is flexible.

31. The OLED structure of claim 18, wherein said OLED structure is flexible.

32. The OLED structure of claim 19, wherein said OLED structure is flexible.

* * * * *

UNITED STATES PATENT AND TRADEMARK OFFICE
CERTIFICATE OF CORRECTION

PATENT NO. : 6,888,305 B2  Page 1 of 1
DATED : May 3, 2005
INVENTOR(S) : Michael Stuart Weaver It is certified that error appears in the above-identified patent and that said Letters Patent is hereby corrected as shown below:

Title page,
Item [57], ABSTRACT,
Lines 3, 10, 11 and 17, change "multiplayer" to -- multilayer --.

Column 2,
Line 16, change "directionally" to -- directionality --.
Line 55, change "quarter wave" to -- quarter-wave --.

Column 4,
Line 13, after "which", change "acts" to -- act --.
Line 27, change "hetero structure" to -- heterostructure --.

Column 5,
Line 18, after "cathode.", insert a paragraph break, followed by the following text:
-- Fig. 3 illustrates an OLED structure, generally designated by the --.
Line 61, change "a preferably" to -- preferably a --.

Signed and Sealed this

Eighth Day of November, 2005

JON W. DUDAS
*Director of the United States Patent and Trademark Office*